(12) United States Patent
Bezama et al.

(10) Patent No.: US 6,245,185 B1
(45) Date of Patent: Jun. 12, 2001

(54) METHOD OF MAKING A MULTILAYER CERAMIC PRODUCT WITH THIN LAYERS

(75) Inventors: Raschid J. Bezama, Mahopac; Dinesh Gupta, Hopewell Junction; Govindarajan Natarajan, Pleasant Valley, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/354,223

(22) Filed: Jul. 15, 1999

(51) Int. Cl.[7] .................................................. B32B 31/18
(52) U.S. Cl. .................. 156/252; 156/89.12; 156/89.15; 156/89.16; 156/89.18; 156/89.19; 156/89.21; 156/252; 427/96
(58) Field of Search ............................. 156/89.12, 89.16, 156/89.17, 89.18, 89.21, 252, 253, 89.15, 89.19; 29/851; 427/96

(56) References Cited

U.S. PATENT DOCUMENTS

| | | | |
|---|---|---|---|
| 3,770,529 | * | 11/1973 | Anderson . |
| 4,806,188 | * | 2/1989 | Rellick ............................. 156/253 X |
| 5,089,071 | * | 2/1992 | Tominaga et al. . |
| 5,300,163 | * | 4/1994 | Ohtaki . |
| 5,480,503 | * | 1/1996 | Casey et al. ....................... 156/252 X |
| 5,601,672 | * | 2/1997 | Casey et al. ....................... 156/252 X |
| 5,603,147 | | 2/1997 | Bischoff et al. ..................... 29/25.42 |
| 5,755,903 | * | 5/1998 | Garant et al. ..................... 156/252 X |
| 5,976,286 | * | 11/1999 | Natarajan . |

OTHER PUBLICATIONS

Natarajan U.S. Patent Application, Serial No. 08/950,222 filed Oct. 14, 1997.

* cited by examiner

Primary Examiner—Curtis Mayes
(74) Attorney, Agent, or Firm—Ira D. Blecker

(57) ABSTRACT

Disclosed is a method of making a multilayer ceramic product with thin layers, the method including the steps of: (a) providing a thick ceramic greensheet and a plurality of thin ceramic greensheets; (b) aligning and stacking the thin ceramic greensheet on the thick ceramic greensheet; (c) bonding the thin ceramic greensheet to the thick ceramic greensheet; (d) aligning and stacking one thin ceramic greensheet on the previous thin ceramic greensheet; (e) bonding the thin ceramic greensheet in step (d) to the previous thin ceramic greensheet; and (f) simultaneously forming at least one unfilled via in the stack of thick and thin ceramic greensheets.

27 Claims, 3 Drawing Sheets

METHOD OF MAKING A MULTILAYER CERAMIC PRODUCT WITH THIN LAYERS

BACKGROUND OF THE INVENTION

The present invention relates to a method for forming laminated structures and more particularly to a method for forming multilayer ceramic products using very thin greensheets and/or very thin greensheets with dense electrically conductive patterns.

Multilayer ceramic (MLC) structures are used in the production of electronic substrates and devices. The MLCs can have various layering configurations. For example, an MLC circuit substrate may comprise patterned metal layers which act as electrical conductors sandwiched between ceramic layers which act as a dielectric medium. For the purposes of interlayer interconnections, most of the ceramic layers have via holes, more typically called vias. Prior to lamination, the vias are typically filled with an electrically conductive paste, such as a metallic paste, and sintered to form vias which provide the electrical connection between the layers. In addition, the MLC substrates may have termination pads for attaching semiconductor chips, connector leads, capacitors, resistors, to name a few.

Generally, conventional ceramic structures are formed from ceramic green sheets which are prepared from a slurry of ceramic particulate, thermoplastic polymer binders, plasticizers, and solvents. This composition is spread or cast into ceramic sheets or slips from which the solvents are subsequently volatilized to provide coherent and self-supporting flexible greensheets. After via formation, metal paste screening, stacking and laminating, the greensheets are fired or sintered at temperatures sufficient to burn-off or remove the unwanted polymeric binder resin and sinter the ceramic particulate together into a densified ceramic substrate. The present invention is directed to the via forming, screening, stacking and laminating steps of this process.

In the MLC packaging industry it is very common to use green sheets of various thicknesses. The thicknesses can typically vary from 6 mils to 30 mils and in general the art of punching and metallizing these layers is well known. Greensheet thicknesses below 6 mils, in general, are very scarcely used due to a variety of reasons. Chief among these reasons is that the handling, punching, screening and stacking of greensheets thinner than about 6 mils pose tremendous technical challenges. In fact, the use of one to two mils thick ceramic greensheets, which are punched and screened, using traditional MLC technology does not exist in the prior art. The term thin greensheet as used herein means that the thickness of the greensheet can be anywhere from about 0.5 mil to about 6.0 mils. Production level screening and stacking of thin greensheets is not possible with the current technology as the thin greensheets tend to shrink a lot and distort during the process of making MLC packages.

In the MLC packaging industry, it is very common to use capacitor layers, power layers and ground layers. The capacitance necessary in a package depends on the design of the package and such capacitance is obtained by choosing proper dielectric layer thickness and metal area within a layer. The industry is always striving for higher capacitance and since the metal area is maxing out for a given substrate size it is necessary to use thinner dielectric layers between electrodes to obtain the required capacitance. For example, as a rule of thumb one could double the capacitance for a given dielectric system and electrode metal area by decreasing the dielectric layer thickness by half. Additionally the number of layers needed for capacitance in a package as well has been reduced by about 50 percent. The reduction in the number of layers is desirable, as it reduces the cost and the process of making the substrate.

Bischoff et al. U.S. Pat. No. 5,603,147, the disclosure of which is incorporated by reference herein, discloses the manufacture of capacitors wherein 1.5 mil thick layers are sequentially assembled upon a carrier. After formation of the ceramic laminate, the ceramic laminate is removed from the carrier.

Natarajan U.S. patent application Ser. No.08/950,222, filed Oct. 14, 1997, now U.S. Pat. No. 5,976,286, the disclosure of which is incorporated by reference herein, discloses a sublamination process wherein a punched thin ceramic greensheet is bonded to a punched and screened thick ceramic greensheet and then the sublaminate is screened with a metallic material. Subsequently, a further punched thin ceramic greensheet is bonded to the sublaminate followed by screening with a metallic material. This process continues until the desired number of greensheets have been laminated to form the sublaminate.

The method of the present invention enables the via forming, screening, stacking and handling of very thin green sheets and/or green sheets with very dense metallized patterns in the manufacture of multilayer ceramic packages. With the preferred embodiment, thin greensheets were stacked and bonded to thick greensheets and then the stack had vias formed to result in a substructure which yielded excellent stability in screening and enabled excellent handling and alignment in stacking. The greensheet may have electrically conductive features within them, such as, a via, or over them, such as, a line or cap, to name a few.

BRIEF SUMMARY OF THE INVENTION

Bearing in mind the problems and deficiencies of the prior art, it is therefore one purpose of the present invention to provide a novel method for producing metallized thin greensheets including substructures in multilayer ceramic products as capacitor layers, power layers or ground layers.

Another purpose of the present invention is to provide a method that will ensure alignment of the vias in a multilayer ceramic product.

Still another purpose of the present invention is to provide a method that will ensure higher capacitance in a multilayer ceramic product.

Yet another purpose of the present invention is to provide a method for metallizing a thin greensheet without any detrimental distortion.

Still yet another purpose of the present invention is to have a method that will ensure handling of thin greensheets for multilayer ceramic products without damage to the thin greensheets.

Another purpose of the present invention is to laminate several stacked greensheets to produce substructures.

Other purposes, objects and advantages of the present invention will become apparent after referring to the following specification considered in conjunction with the accompanying drawings.

Therefore, one aspect of the invention relates to a method of making a multilayer ceramic product with thin layers, the method comprising the steps of:

(a) providing at least one thick ceramic greensheet and a plurality of thin ceramic greensheets;

(b) aligning and stacking one thin ceramic greensheet on the thick ceramic greensheet;

(c) bonding the thin ceramic greensheet to the thick ceramic greensheet;

(d) aligning and stacking one thin ceramic greensheet on the previous thin ceramic greensheet;

(e) bonding the thin ceramic greensheet in step (d) to the previous thin ceramic greensheet; and (f) simultaneously forming at least one unfilled via in the stack of thick and thin ceramic greensheets.

A second aspect of the invention relates to a method of making a multilayer ceramic product with thin layers, the method comprising the steps of:

(a) providing at least one thick ceramic greensheet and a plurality of thin ceramic greensheets;

(b) aligning and stacking one thin ceramic greensheet on the thick ceramic greensheet;

(c) bonding the thin ceramic greensheet to the thick ceramic greensheet;

(d) aligning and stacking one thin ceramic greensheet on the previous thin ceramic greensheet;

(e) bonding the thin ceramic greensheet in step (d) to the previous thin ceramic greensheet;

(f) repeating steps (d) and (e) until a predetermined number of thin ceramic greensheets have been aligned, stacked and bonded;

(g) simultaneously forming at least one unfilled via in the stack of thick and thin ceramic greensheets; and (h) filling the at least one unfilled via with an electrically conductive material.

A third aspect of the invention relates to a method of making a multilayer ceramic product with thin layers, the method comprising the steps of:

(1) forming a multilayer ceramic subproduct according to the following steps:

(a) providing at least one thick ceramic greensheet and a plurality of thin ceramic greensheets;

(b) aligning and stacking one thin ceramic greensheet on the thick ceramic greensheet;

(c) bonding the thin ceramic greensheet to the thick ceramic greensheet;

(d) aligning and stacking one thin ceramic greensheet on the previous thin ceramic greensheet;

(e) bonding the thin ceramic greensheet in step (d) to the previous thin ceramic greensheet;

(f) repeating steps (d) and (e) until a predetermined number of thin ceramic greensheets have been aligned, stacked and bonded;

(g) simultaneously forming at least one unfilled via in the stack of thick and thin ceramic greensheets; and (h) filling the at least one unfilled via with an electrically conductive material; and (2) aligning, stacking and bonding the multilayer ceramic subproduct formed in step (1) with at least one of another multilayer ceramic subproduct, a thin ceramic greensheet or a thick ceramic greensheet.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DESCRIPTION OF THE INVENTION

The method of the present invention enables the handling, screening, stacking and via forming of thin ceramic layers. These thin ceramic layers are used in the semiconductor industry for a variety of purposes, such as, for example, for a capacitor structure, for power or ground layers, or for a fine line pattern structure in MLC packages, to name a few. Basically, the invention is a novel method where a thicker ceramic greensheet which may be screened is used as a base or a permanent support for a thinner ceramic greensheet layer. The stack of thick and thin greensheets have vias formed as a unit. Additionally, the thicker permanent ceramic base acts as a shrinkage and distortion restrainer when the thinner ceramic greensheet is screened with conductive paste and dried. Furthermore, the thinner greensheet on the thicker green sheet base which then have vias formed as a unit have eliminated handling problems of thin, screened ceramic greensheets and via formation and alignment problems associated with thin, screened ceramic greensheets.

Figure 1A:
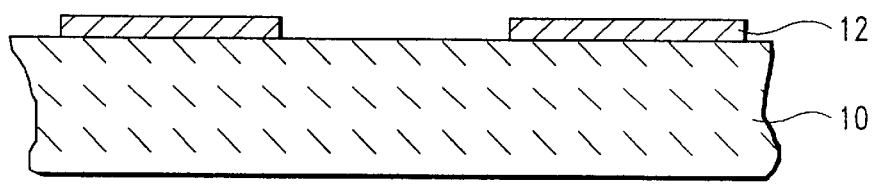
FIGS. 1(A) to (E) illustrate the method according to the present invention.

Referring to the Figures in more detail, and particularly referring to FIGS. 1(A) to (E), there is disclosed the method according to the present invention of making a multilayer ceramic product with thin layers. Thick ceramic greensheet 10 is formed according to conventional methods and then optionally screened with a metallic or composite paste to form features 12 as shown in FIG. 1(A). Features 12 are desirable here for forming capacitor structures but they are not necessary for achieving the purposes of the present invention.

Thickness of a greensheet is a relative measure and it means as thick as the design warrants and as thick as one could cast and personalize the greensheet. Because it is a thicker greensheet, it is possible to form vias and screen these layers with conventional techniques without any detrimental pattern distortion and radial error although, for the present invention, the thick ceramic greensheet 10 does not have vias formed at this time. In general a radial error greater than about 1.2 mils (plus and minus) is considered detrimental. For today's technology, a thick ceramic greensheet should be considered to have a thickness greater than about 6 mils.

Thin ceramic greensheets are formed according to conventional methods. The thinness of a greensheet again is a relative measure and it means as thin as one could preform and handle the thin ceramic greensheet. For today's technology, the thickness ranges from about 0.5 to 6 mils. Such thin ceramic greensheets are difficult to handle and form vias in and all but impossible to screen.

Figure 1B:
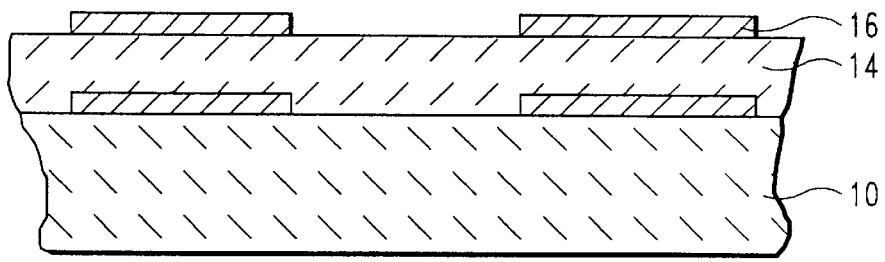

Referring now to FIG. 1(B), thin ceramic greensheet 14 is aligned with and stacked on thick ceramic greensheet 10 and then bonded to the thick ceramic greensheet 10.

The step of bonding may be accomplished by a thermal or chemical process. It is very important that the bonding process used should not distort the features 12 (if present), located on the thicker sheet 10. One example of a thermal process is a lamination process wherein lamination pressures of less than 800 psi and a temperature of less than 90° C. were found suitable for the bonding operation. Another example of a thermal process is where only the corners of the thin ceramic greensheet 14 are tacked to the thicker ceramic greensheet 10.

Alternatively, the bonding could be done by a chemical process where the chemical used is preferably selected from a group comprising water, methanol, methyl-iso-butyl ketone, isopropyl alcohol, binders, and pastes/slurries containing, or containing polymer coated, alumina, aluminum nitride, borosilicate, glass ceramic, copper, molybdenum, tungsten, nickel, to name a few. In operation, a chemical is applied to one or both of the ceramic greensheets to be joined so as to chemically bond the two ceramic greensheets together. The chemical may be an adhesive (or act like an adhesive) with respect to the two greensheets to be joined.

Subsequent to the step of bonding, conductive material paste is screened on the thin ceramic greensheet 14 to form metallic features 16.

Figure 1C:
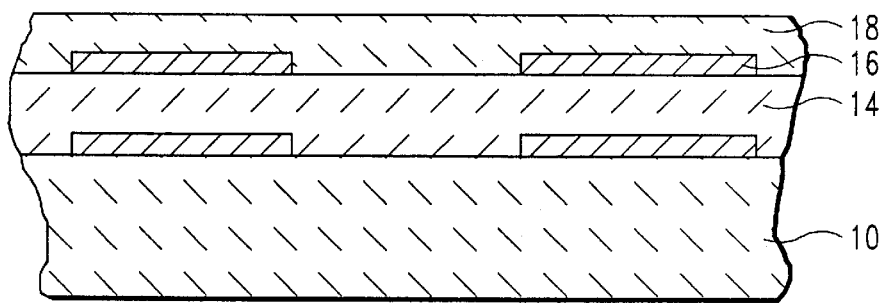

At this point in the manufacturing operation, as many thin ceramic greensheets are added to the stack as are necessary to achieve the product that is desired to be manufactured. For example, as shown in FIG. 1(C), a further thin ceramic greensheet 18 has been aligned and stacked and then bonded as previously described. Additional thin ceramic greensheets may also be aligned, stacked and bonded as needed to build up the desired product.

Figure 1D:
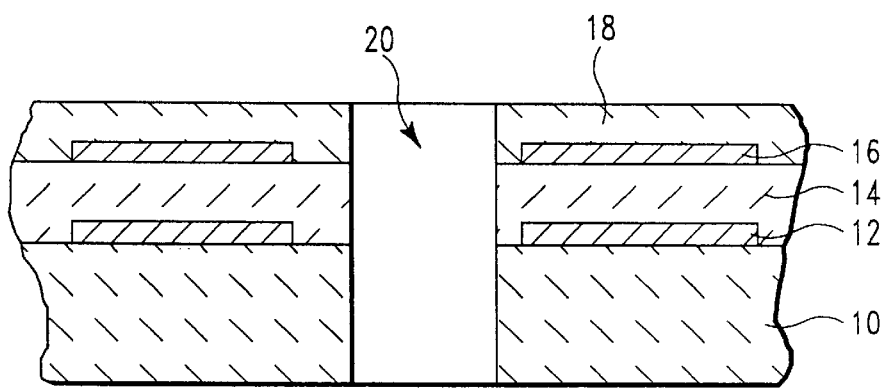

Once the desired stack of ceramic greensheets has been formed, a via 20 is formed through the entire stack as shown in FIG. 1(D). Due to the fact that the via 20 in all layers 10, 14, 18 is simultaneously formed, the via 20 is perfectly aligned from layer to layer. The via 20 may be formed by any conventional method such as punching or laser drilling.

Figure 1E:
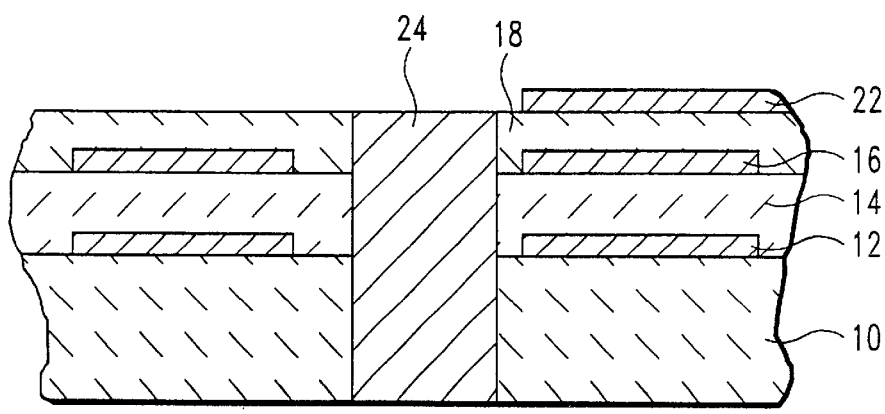

Subsequently, via 20 is filled with conductive material 24 as shown in FIG. 1(E). If desired, surface conductive metallization 22 may be screened to complete the multilayer ceramic product 30 as shown in FIG. 1(E). It should be appreciated that conductive metallization 22 can be applied prior to the forming of via 20.

The electrically conductive material used with this invention is preferably selected from a group comprising copper, molybdenum, nickel, tungsten, metal with glass frit, metal with glass grit, to name a few.

The material for the thick and thin ceramic green sheets is preferably selected from a group comprising alumina, alumina with glass frit, borosilicate glass, aluminum nitride, glass ceramic, to name a few.

Figure 2:
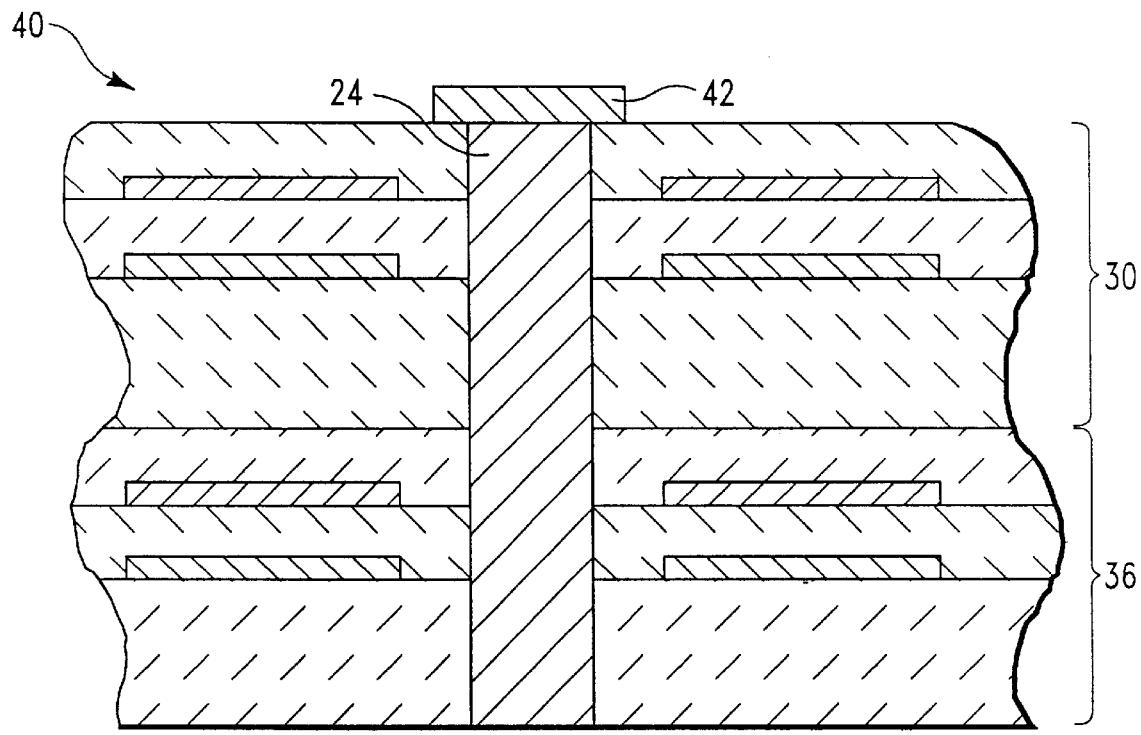
FIG. 2 illustrates a ceramic product formed by combining the structure formed in FIG. 1(E) with a like structure.
Figure 3:
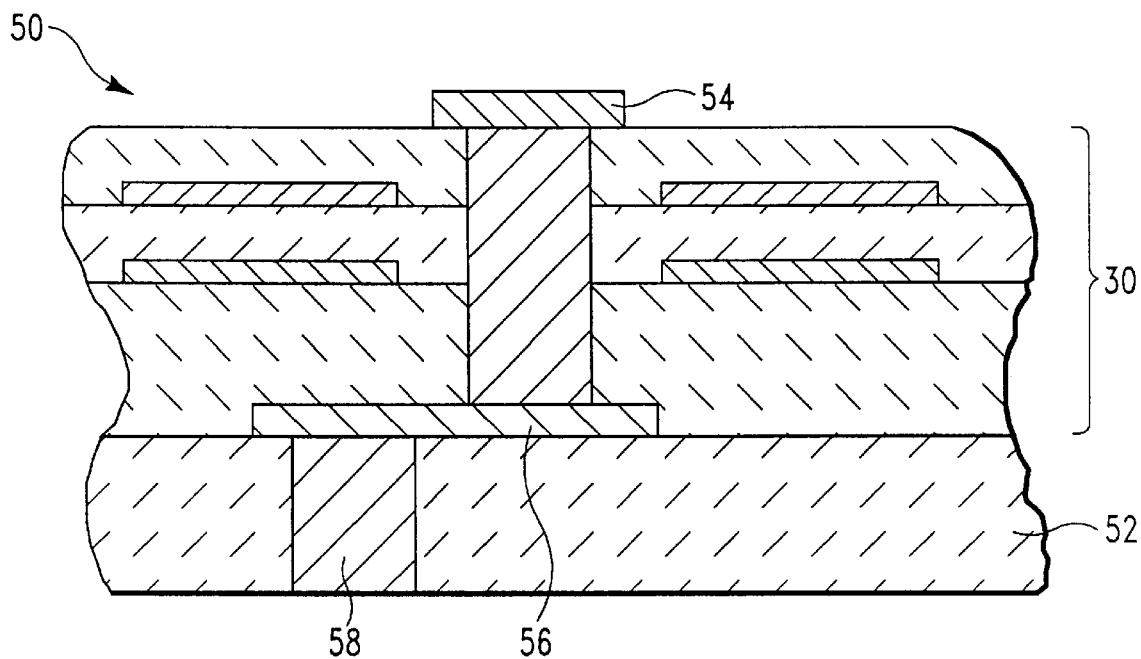
FIG. 3 illustrates a ceramic product formed by combining the structure formed in FIG. 1(E) with another thick ceramic greensheet.
Figure 4:
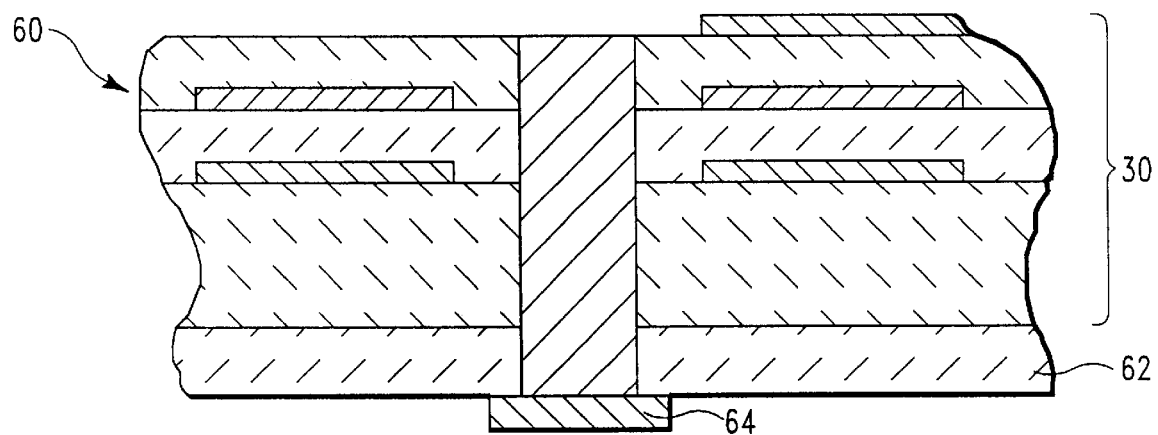
FIG. 4 illustrates a ceramic product formed by combining the structure formed in FIG. 1(E) with another thin ceramic greensheet.

While the multilayer ceramic product 30 formed in FIG. 1(E) is a useful product in and of itself, it may be also be used as the building block for other multilayer ceramic products as illustrated in FIGS. 2 to 4.

Referring to FIG. 2, multilayer ceramic product 30 has been aligned, stacked and bonded to the same or a similar multilayer ceramic product 30 to result in multilayer ceramic product 40. Metallized cap 42 has been added for purposes of illustration. Additional multilayer ceramic products 30 may be added to the stack if desired.

As another example, multilayer ceramic product 30 has been aligned, stacked and bonded with another thick ceramic greensheet 52 to result in multilayer ceramic product 50 as shown in FIG. 3. Thick ceramic greensheet 52 has metal filled via 58 which communicates to multilayer ceramic product 30 through metallization 56. Again, for purposes of illustration, multilayer ceramic product 50 may have metallization cap 54. Additional thick ceramic greensheets may also be added to the stack if desired.

Referring now to FIG. 4, multilayer ceramic product 30 has been aligned, stacked and bonded with thin ceramic greensheet 62 to form multilayer ceramic product 60. For purposes of illustration, multilayer ceramic product 60 has metallized cap 64. Additional thin ceramic greensheets may be added to the stack if desired.

Figure 5:
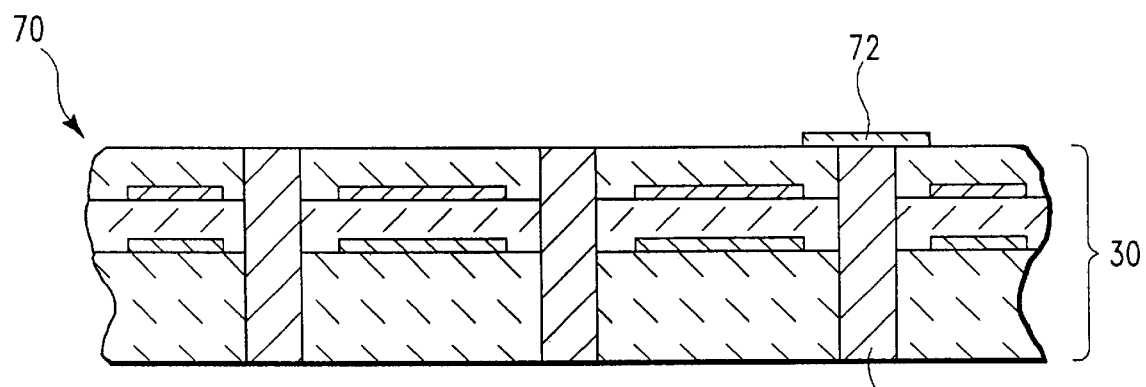
FIG. 5 illustrates the ceramic product formed in FIG. 1(E) with one of the vias capped with a dielectric material.

It should be understood that while only one via is shown in FIGS. 1(E) to 4, it is conventional for there to be a plurality of such vias. Multilayer ceramic product 70 shown in FIG. 5 illustrates such a product. If multilayer ceramic product 30 represents a building block for other multilayer ceramic products as discussed above with respect to FIGS. 2 to 4, then it may be desirable to form dielectric cap 72 on at least one of the vias 24 of multilayer ceramic product 70. Such a dielectric cap 72 may be used to cap vias that are not needed.

It should be understood that as to any of the structures illustrated in FIGS. 1(E) to 5, after all the desired thin and thick ceramic greensheets have been aligned, stacked, bonded, metallized, and vias formed, the resulting multilayer ceramic product 30–70 formed is in the green, unsintered state. Completion of the multilayer ceramic product 30–70 is attained by sintering the product as is conventional in the art.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method of making a multilayer ceramic product with thin layers, the method comprising the steps of:
    (a) providing at least one thick ceramic greensheet and a plurality of thin ceramic greensheets;
    (b) aligning and stacking one thin ceramic greensheet on the thick ceramic greensheet;
    (c) bonding the thin ceramic greensheet to the thick ceramic greensheet;
    (d) aligning and stacking one thin ceramic greensheet on the previous thin ceramic greensheet;
    (e) bonding the thin ceramic greensheet in step (d) to the previous thin ceramic greensheet; and
    (f) simultaneously forming at least one unfilled via in the stack of thick and thin ceramic greensheets.

2. The method of claim 1 further comprising the step, prior to step (f), of repeating steps (d) and (e) until a predetermined number of thin ceramic greensheets have been aligned, stacked and bonded.

3. The method of claim 1 further comprising the step prior to step (f), of repeating steps (d) and (e) followed by a further step of screening an electrically conductive material on the one thin ceramic greensheet until a predetermined number of thin ceramic greensheets have been aligned, stacked and bonded.

4. The method of claim 1 further comprising the step of filling the at least one unfilled via with an electrically conductive material.

5. The method of claim 4 wherein the electrically conductive material is selected from the group consisting of copper, molybdenum, nickel, tungsten, metal with glass frit and metal with glass grit.

6. The method of claim 1 further comprising the step, prior to step (b), of screening an electrically conductive material on the thick ceramic greensheet.

7. The method of claim 6 wherein the electrically conductive material is selected from the group consisting of copper, molybdenum, nickel, tungsten, metal with glass frit and metal with glass grit.

8. The method of claim 1 further comprising the step, prior to step (d) of screening an electrically conductive material on the thin ceramic greensheet.

9. The method of claim 1 further comprising the step of screening an electrically conductive material on at least one of the thin ceramic greensheets.

10. The method of claim 1 wherein the material for the thin ceramic greensheets is selected from the group consisting of alumina, alumina with glass frit, borosilicate glass, aluminum nitride and glass ceramic.

11. The method of claim 1 wherein the material for the at least one thick ceramic greensheet is selected from the group consisting of alumina, alumina with glass frit, borosilicate glass, aluminum nitride and glass ceramic.

12. The method of claim 1 wherein the thickness of the thin ceramic greensheets is between about 0.5 mils to about 6.0 mils.

13. The method of claim 1 wherein the at least one thick ceramic greensheet is at least 6 mils thick.

14. The method of claim 1 wherein the bonding between the at least one thick ceramic greensheet and the thin ceramic greensheet and between the thin ceramic greensheets is done using a process selected from the group consisting of thermal processes and chemical processes.

15. The method of claim 1 wherein the steps of bonding are done at a temperature of less than about 90° C.

16. The method of claim 1 wherein the steps of bonding are done at a pressure of less than about 800 psi.

17. The method of claim 1 wherein the steps of bonding are done in a chemical environment, and wherein the chemical of the chemical environment is selected from the group consisting of water, methanol, methyl-iso-butyl ketone, isopropyl alcohol, binders, pastes/slurries containing alumina, aluminum nitride, borosilicate, glass ceramic, copper, molybdenum, tungsten and nickel, and pastes/slurries containing polymer coated alumina, aluminum nitride, borosilicate, glass ceramic, copper, molybdenum, tungsten and nickel.

18. A method of making a multilayer ceramic product with thin layers, the method comprising the steps of:
   (a) providing at least one thick ceramic greensheet and a plurality of thin ceramic greensheets;
   (b) aligning and stacking one thin ceramic greensheet on the thick ceramic greensheet;
   (c) bonding the thin ceramic greensheet to the thick ceramic greensheet;
   (d) aligning and stacking one thin ceramic greensheet on the previous thin ceramic greensheet;
   (e) bonding the thin ceramic greensheet in step (d) to the previous thin ceramic greensheet;
   (f) repeating steps (d) and (e) until a predetermined number of thin ceramic greensheets have been aligned, stacked and bonded;
   (g) simultaneously forming at least one unfilled via in the stack of thick and thin ceramic greensheets; and
   (h) filling the at least one unfilled via with an electrically conductive material.

19. The method of claim 18 further comprising the step, prior to step (b), of screening an electrically conductive material on the thick ceramic greensheet.

20. The method of claim 18 wherein in step (f) after step (e) has been repeated followed by a further step of screening an electrically conductive material on the one thin ceramic greensheet.

21. The method of claim 18 further comprising the step, prior to step (d), of screening an electrically conductive material on the thin ceramic greensheet.

22. The method of claim 18 further comprising the step of screening an electrically conductive material on at least one of the thin ceramic greensheets.

23. The method of claim 18 wherein the thickness of the thin ceramic greensheets is between about 0.5 mils to about 6.0 mils.

24. The method of claim 18 wherein the at least one thick ceramic greensheet is at least 6 mils thick.

25. A method of making a multilayer ceramic product with thin layers, the method comprising the steps of:
   (1) forming a multilayer ceramic subproduct according to the following steps:
      (a) providing at least one thick ceramic greensheet and a plurality of thin ceramic greensheets;
      (b) aligning and stacking one thin ceramic greensheet on the thick ceramic greensheet;
      (c) bonding the thin ceramic greensheet to the thick ceramic greensheet;
      (d) aligning and stacking one thin ceramic greensheet on the previous thin ceramic greensheet;
      (e) bonding the thin ceramic greensheet in step (d) to the previous thin ceramic greensheet;
      (f) repeating steps (d) and (e) until a predetermined number of thin ceramic greensheets have been aligned, stacked and bonded;
      (g) simultaneously forming at least one unfilled via in the stack of thick and thin ceramic greensheets; and
      (h) filling the at least one unfilled via with an electrically conductive material; and
   (2) aligning, stacking and bonding the multilayer ceramic subproduct formed in step (1) with at least one of another multilayer ceramic subproduct, a thin ceramic greensheet or a thick ceramic greensheet.

26. The method of claim 25 wherein the thickness of the thin ceramic greensheets is between about 0.5 mils to about 6.0 mils.

27. The method of claim 25 wherein the thick ceramic greensheet is at least 6 mils thick.

* * * * *